(12) United States Patent
Cho et al.

(10) Patent No.: US 10,848,008 B2
(45) Date of Patent: Nov. 24, 2020

(54) WIRELESS POWER TRANSMISSION DEVICE FOR SEAT

(71) Applicant: DAECHANG SEAT CO., LTD-DONGTAN, Hwaseong-si (KR)

(72) Inventors: Chan Ki Cho, Gwangju (KR); Hyun Chul Woo, Bucheon-si (KR)

(\*) Notice: Subject to any disclaimer, the term of this patent is extended or adjusted under 35 U.S.C. 154(b) by 12 days.

(21) Appl. No.: 16/308,473

(22) PCT Filed: May 31, 2018

(86) PCT No.: PCT/KR2018/006209
§ 371 (c)(1),
(2) Date: Dec. 9, 2018

(87) PCT Pub. No.: WO2018/221977
PCT Pub. Date: Dec. 6, 2018

(65) Prior Publication Data
US 2019/0260238 A1    Aug. 22, 2019

(30) Foreign Application Priority Data

May 31, 2017  (KR) .................. 10-2017-0067644
May 31, 2017  (KR) .................. 10-2017-0067645

(51) Int. Cl.
*H02J 50/27*  (2016.01)
*H02J 50/05*  (2016.01)
(Continued)

(52) U.S. Cl.
CPC .............. *H02J 50/27* (2016.02); *B60N 2/06* (2013.01); *B60N 2/56* (2013.01); *B60N 2/90* (2018.02);
(Continued)

(58) Field of Classification Search
CPC ... B60N 2/00; B60N 2/02; B60N 2/06; B60N 2/44; B60N 2/56; B60N 2/5678; H02J 50/10; H02J 50/90; H02J 50/27; H02J 50/05; H02J 50/12; H02J 7/025; H02J 5/005; H04B 5/00; H04B 5/0037
USPC .......................................................... 307/104
See application file for complete search history.

(56) References Cited

U.S. PATENT DOCUMENTS 9,950,666 B1 * 4/2018 Tseng .................... B60N 2/0244
10,286,862 B2 * 5/2019 Pike ........................ H02J 7/025
(Continued)

FOREIGN PATENT DOCUMENTS

JP   2016-512010 A    4/2016
KR   10-2003-0094207  12/2003
(Continued)

*Primary Examiner* — Rexford N Barnie
*Assistant Examiner* — Jagdeep S Dhillon
(74) *Attorney, Agent, or Firm* — Jake K. Lee

(57) ABSTRACT

The disclosure disclosed herein provides a wireless power transmission device that wirelessly transmits power to electronic equipment coupled to a seat regardless of a position of the seat. According to an embodiment of the disclosure disclosed herein, a wireless power transmission device includes a power receiving unit coupled to a lower portion of a seat, and a power transmitting unit spaced apart from and below the power receiving unit, in which the power receiving unit is spaced apart from the power transmitting unit and slides into a moving direction of the seat, and the power receiving unit wirelessly receives power from the power transmitting unit and supplies power to electronic equipment installed in the seat.

8 Claims, 15 Drawing Sheets

(51) Int. Cl.
- *B60N 2/90* (2018.01)
- *B60N 2/06* (2006.01)
- *B60N 2/56* (2006.01)
- *H02J 50/12* (2016.01)
- *H02J 50/70* (2016.01)
- *H03H 7/01* (2006.01)
- *H03H 7/32* (2006.01)

(52) U.S. Cl.
CPC .............. *H02J 50/05* (2016.02); *H02J 50/12* (2016.02); *H02J 50/70* (2016.02); *H03H 7/01* (2013.01); *H03H 7/32* (2013.01)

(56) References Cited

U.S. PATENT DOCUMENTS

| | | |
|---|---|---|
| 2009/0029522 A1 | 1/2009 | Cho et al. |
| 2011/0285186 A1 | 11/2011 | Demmelmeier et al. |
| 2013/0005251 A1* | 1/2013 | Soar ........................ H02J 50/40 455/41.1 |
| 2014/0091635 A1* | 4/2014 | Sugino .................... H02J 50/12 307/104 |
| 2014/0252813 A1* | 9/2014 | Lee ........................ H02J 50/12 297/180.12 |
| 2016/0379459 A1* | 12/2016 | Trang ..................... G08B 21/24 340/457 |
| 2017/0106771 A1* | 4/2017 | Bonk ....................... B60N 2/06 |
| 2017/0136886 A1 | 5/2017 | Desai et al. |
| 2018/0212476 A1* | 7/2018 | Nguyen ................ B60L 53/124 |

FOREIGN PATENT DOCUMENTS

| | | |
|---|---|---|
| KR | 10-1518647 | 4/2015 |
| KR | 10-2017-0026836 | 8/2015 |
| KR | 10-2015-0130542 | 11/2015 |
| KR | 10-2016-0039327 | 4/2016 |
| KR | 10-2017-0010736 | 2/2017 |

* cited by examiner

WIRELESS POWER TRANSMISSION DEVICE FOR SEAT

CROSS-REFERENCE TO RELATED APPLICATION

This application is a Section 371 National Stage Application of International Patent Application No. PCT/KR2018/006209 filed on May 31, 2018, which claims priority to Korean Patent Application No. 10-2017-0067644 filed on May 31, 2017 and Korean Patent Application No. 10-2017-0067645 filed on May 31, 2017, the entire contents of which are incorporated by reference herein.

TECHNICAL FIELD

The disclosure disclosed herein relates to a wireless power transmission device, and more particularly, to a wireless power transmission device for powering electronic equipment installed in a seat wirelessly.

BACKGROUND

Unless otherwise indicated herein, contents set forth in this section are not a prior art to claims of the present application, and the inclusion in this section should not be considered admitting as a prior art.

Generally, a seat installed in a vehicle is provided with electronic equipment including a motor and a heating wire for the convenience of a passenger. A cable may be installed between the seat and a rail to provide power to the electronic equipment and the cable may be damaged by the movement or rotation of the seat.

In addition, when the heating wire or a ventilation device for the seat is installed inside the seat, the installation structure of the rail may be restricted, and the smooth movement or rotation of the seat may be impossible due to the cable.

In this regard, Korean Patent No. 10-1518647 discloses a power seat power supply for a vehicle, and Korean Patent Publication No. 10-2017-0010736 discloses a wireless power transmission module for a vehicle.

However, the disclosures do not disclose a technology to stably and wirelessly transmit power regardless of the movement or rotation of the seat.

SUMMARY

An object of the disclosure is to provide a wireless power transmission device that wirelessly transmits power to electronic equipment coupled to a seat regardless of a position of the seat.

It is to be understood that the disclosure is not limited to the technical problems as described above, and another technical problem may be derived from the following description.

According to an embodiment of the disclosure, a wireless power transmission device includes a power receiving unit coupled to a lower portion of a seat, and a power transmitting unit spaced apart from each other and disposed below the power receiving unit, in which the power receiving unit is spaced apart from the power transmitting unit and slides into a moving direction of the seat, and the power receiving unit wirelessly receives power from the power transmitting unit and supplies power to electronic equipment installed in the seat.

The power transmitting unit is arranged along an extending direction of rails between the rails coupled to the seat, and may include transmitting coils receiving external power and supplying power to the power receiving unit.

The power receiving unit may include a receiving coil spaced apart from the transmitting coils, disposed above the transmitting coils and wirelessly receiving power through the transmitting coils.

The power receiving unit may include receiving coils formed in a coil shape extending in the extending direction of the rail below the seat and spaced apart from each other in opposite sides.

The transmitting coils are spaced apart from the receiving coils and are formed to surround the receiving coils. The transmitting coils are spaced apart from each other along an extending direction of the receiving coil. A portion of a magnetic field generated around each of the receiving coils may be offset when the power is wirelessly transmitted to the receiving coil through the transmitting coil.

The power transmitting unit may further include a wireless power transmitter connected to the transmitting coils below the transmitting coils, the wireless power transmitter supplying power to the transmitting coil or stopping power supply to the transmitting coils according to an external temperature of the vehicle while a passenger is seated on the seat.

The power transmitting unit may further include a power conversion unit receiving the external power and converting the external power into AC power, and sensing movement of the seat and a foreign matter through a change in current, voltage, or phase due to movement of the receiving coils.

The power receiving unit may transmit unique data stored therein to any one of the transmitting coils positioned directly therebelow and drives any one of the transmitting coils positioned directly below the receiving coil.

The power transmitting unit may further include a wireless power transmitter coupled to each of the transmitting coils, and operating any one of the transmitting coils coupled to an upper portion thereof to transmit power when the receiving coil is positioned directly thereabove.

The wireless power transmitters each wirelessly transmits power to the receiving coil when sensing whether the receiving coil is positioned directly thereabove, through a change in a pressure of pressure sensors formed on the rail.

According to an embodiment of the disclosure disclosed herein, a wireless power transmission device may transmit power wirelessly to electronic equipment coupled to a seat reliably and efficiently, regardless of movement or rotation of the seat.

Further, the wireless power transmission device may improve maintenance and efficiency of a wireless power transmission function by sensing a position of the seat and a foreign matter through current, voltage, or phase according to movement of the seat.

In addition, the wireless power transmission device may sense external temperature and whether a seat is occupied by a passenger, and automatically operate the heating wire of the seat through a threshold value setting of the external temperature and load set by the passenger.

The effect of the present invention described above is obviously exhibited by the constitution of the contents described irrespective of whether or not the inventor perceives it. Therefore, it should be noted that the foregoing effects are only some effects according to the contents described, and are not to be understood as describing all the effects that the inventor grasps or realizes.

Further, the effects of the present invention should be further clarified by the overall description of the specification. Even if it is not written explicitly, the effects, which are recognized by one of ordinary skill in the art as the effect according to the disclosure, should be recognized as the effect which is described in the disclosure.

DETAILED DESCRIPTION OF THE DISCLOSURE

Figure 1:
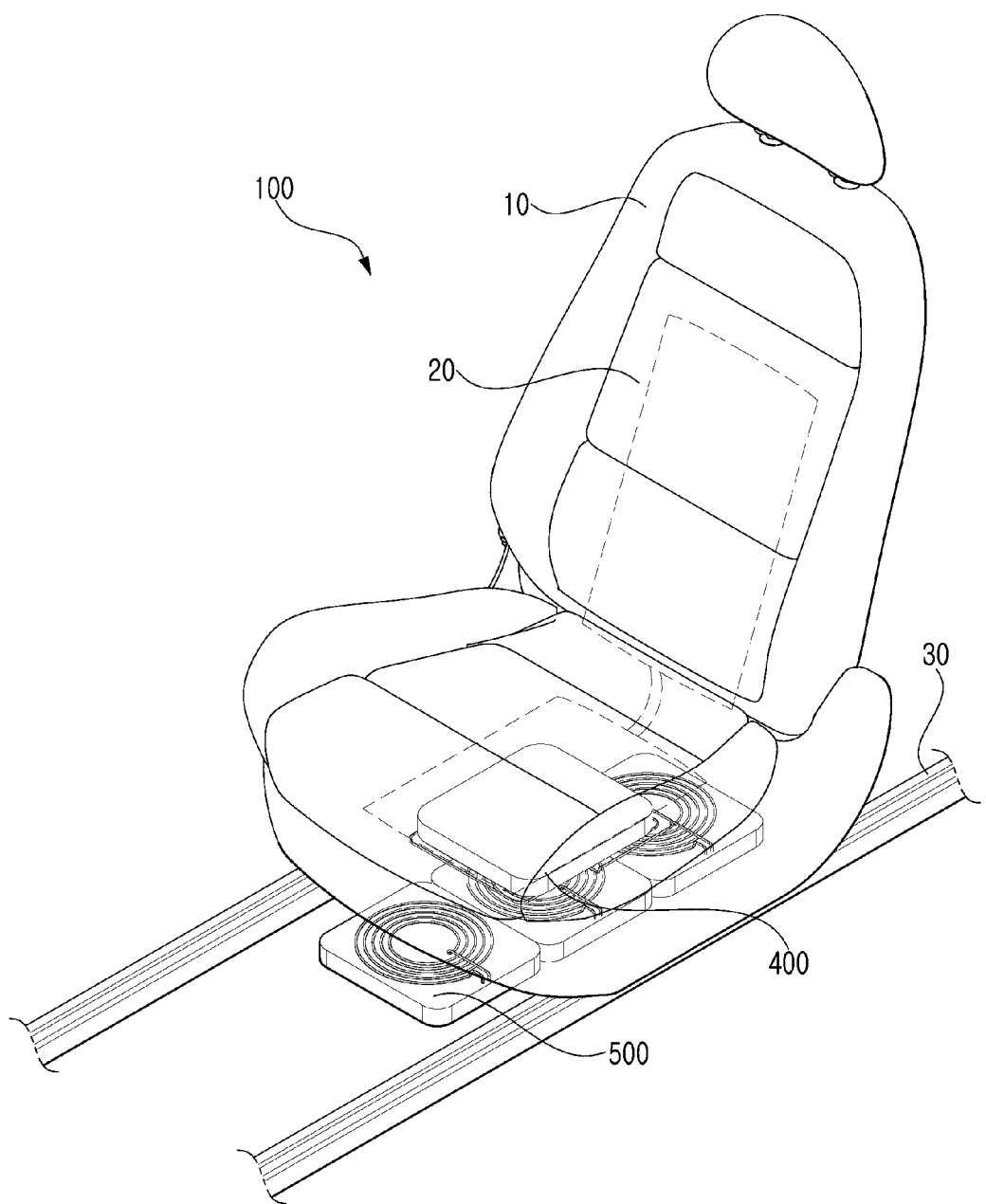
FIG. 1 is a use state diagram of a wireless power transmission device according to an embodiment of the disclosure disclosed herein.

The configuration, operation, and operation effects of a wireless power transmission device according to the preferred embodiment will be described below with reference to the accompanying drawings. In the following drawings, each component is omitted or schematically shown for convenience and clarity, and a size of each component does not reflect an actual size. Further, like reference numerals refer to like elements throughout the specification, and the same reference numerals will be omitted in the drawings.

Figure 2:
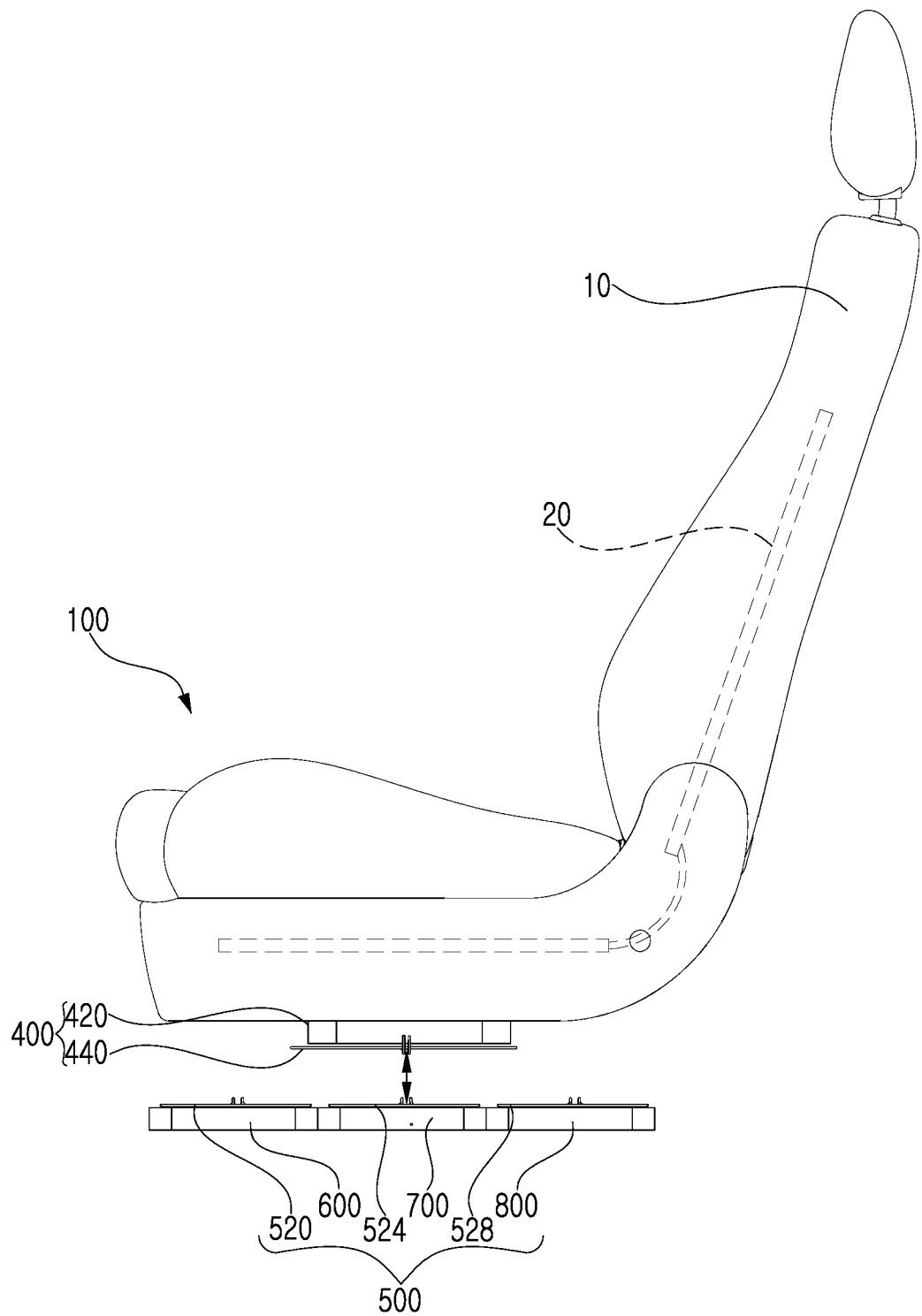
FIG. 2 is a side view illustrating the driving of a power transmitting unit according to movement of a seat in FIG. 1.

FIG. 1 is a use state diagram of a wireless power transmission device according to an embodiment of the disclosure disclosed herein. FIG. 2 is a side view illustrating the driving of a power transmitting unit according to movement of a seat in FIG. 1.

Referring to FIGS. 1 and 2, a wireless power transmission device 100 includes a power receiving unit 400 and a power transmitting unit 500.

The wireless power transmission device 100 wirelessly supplies power to the heating wire 20 disposed within the seat 10 through the power receiving unit 400 and the power transmitting unit 500, instead of a cable connected to the heating wire 20 of the seat coupled to a lower portion of the existing vehicle seat.

The wireless power transmission device 100 transmits power wirelessly to the power receiving unit 400 coupled to a lower portion of the seat 10 through the power transmitting unit 500 connected to an external power source, and then, the power receiving unit 400 supplies power to the heating wire 20 coupled to the seat 10.

Therefore, there is no restriction on a rotation direction and the number of rotation of the seat 10, and the arrangement of the seat 10 disposed between the rails 30 and the arrangement structure of the rails 30 may be free.

The power receiving unit 400 is coupled to the lower portion of the seat 10 and is electrically connected to the heating wire 20. The power transmitting unit 500 disposed at a lower portion is elongated along an extending direction of the rail 30 between the rails 30.

The power receiving unit 400 and the power transmitting unit 500 may transmit power using a magnetic induction scheme, a magnetic resonant scheme, or a wireless power transmission scheme via a microwave. Such a wireless power transmission scheme may be changed depending on a distance between the power receiving unit 400 and the power transmitting unit 500, and an environment inside the vehicle.

The power receiving unit (400) and the power transmitting unit (500) form a resonant channel by matching a resonant frequency between each other to transmit wireless power. To do this, matching of the resonant frequency between the power receiving unit 400 and the power transmitting unit 500 is required.

When the resonant frequency between the power receiving unit 400 and the power transmitting unit 500 are not matched, current, voltage, or phase of each of the power receiving unit 400 or the power transmitting unit 500 is changed.

The power receiving unit 400 or the power transmitting unit 500 may sense changes in internal current, voltage, or phase due to forward or backward sliding movement of the seat 10. The power transmitting unit 500 may prevent power dissipation by interrupting the wireless power transmission of a part where the wireless power transmission is not performed through data communication with each other.

Figure 3:
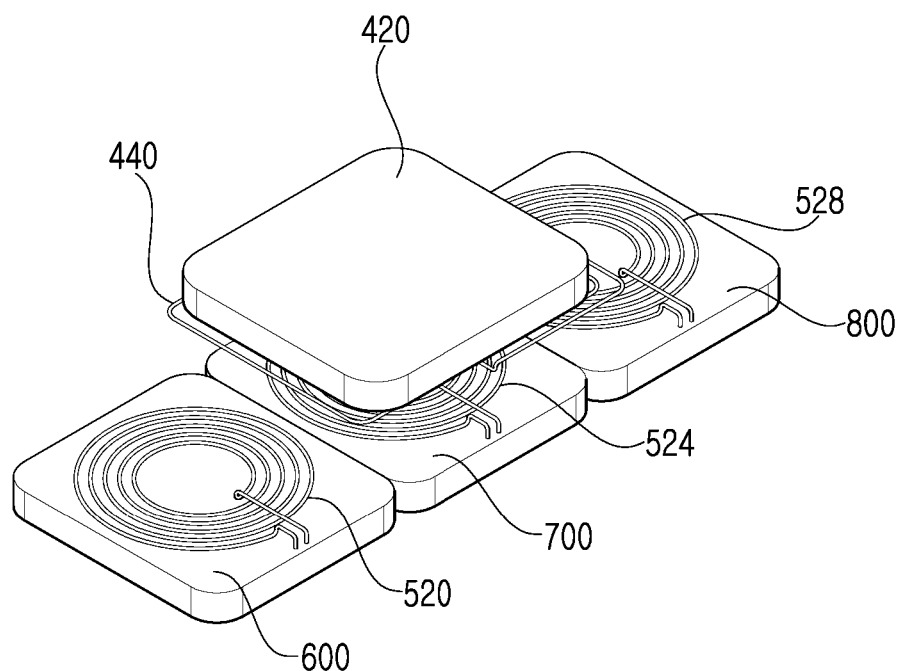
FIG. 3 is a perspective view of a power receiving unit and a power transmitting unit in FIG. 1.

FIG. 3 illustrates a perspective view of a power receiving unit and a power transmitting unit in FIG. 1.

As shown in FIG. 3, the power receiving unit 400 includes a wireless power receiver 420 and a receiving coil 440.

When the power receiving unit 400 transmits unique data stored in the power receiving unit 400 to the power transmitting unit 500 positioned directly below the power receiving unit 400, it is possible to prevent power dissipation by controlling any one of transmitting coils 520, 524, and 528 of the power transmitting unit 500 receiving the unique data to be driven for wireless power transmission.

The wireless power receiver 420 transfers power received through the receiving coil 440 to the electronic equipment including the heating wire 20, and demodulates the data transmitted through the power transmitting unit 500 and outputs it to a controller arranged in the wireless power receiver 420. The wireless power receiver 420 includes a modem for modulating data input from the controller and outputting it to a receiving coil 440.

The wireless power receiver 420 may have a battery therein. When the battery is disposed inside, the seat 10 may be rotated even when the external power source is turned off through a power management device for managing the battery, and thus, it may be used easily when an emergency occurs.

The receiving coil 440 further includes a separate low-frequency coil. The receiving coil 440 may transmit the unique data stored by the controller of the wireless power receiver 420 to the power transmitting unit 500 and transmit the unique data to only any one of the transmitting coil 520, 524, 528 of the power transmitting unit 500, as described below.

The power transmitting unit 500 includes transmitting coils 520, 524, 528 and wireless power transmitters 600, 700 and 800.

One of the transmitting coils 520, 524, 528 may be formed as a low-frequency coil 542, and the remaining two of transmitting coils 520, 524, 528 may be formed as a high-frequency coil 544.

Each of the transmitting coils 520, 524, 528 is coupled to an upper portion of each of the wireless power transmitters 600, 700, 800.

As described later in FIG. 13, the low-frequency coil 542 transmits power wirelessly or transmits and receives data with the low-frequency coil through the receiving coil 440, and the high-frequency coil 544 supplies power wirelessly through the receiving coil 440.

The receiving coil 440 further includes a low-frequency receiving coil or a high-frequency receiving coil to enable power reception and data transmission/reception with the low-frequency coil 542 or the high-frequency coil 544 as will be described later.

When any one of the transmitting coils 520, 524, 528 positioned directly below the receiving coil 440 receives the unique data, any one of the wireless power transmitters 600, 700, 800 coupled to any one of the transmitting coils 520, 524, 528 received the unique data drives the wireless power transmission.

For example, when a center of the receiving coil 440 and a center of the transmitting coil 520 are positioned on the same vertical line as the seat 10 moves to a position directly above the transmitting coil 520, the transmitting coil 520 receives the unique data transmitted from the receiving coil 440, the wireless power transmitter 600 transmits power wirelessly to the receiving coil 440 through the transmitting coil 520, and the driving of the remaining transmitting coils 524, 528 is stopped.

Accordingly, with the transmission and reception of the unique data between the receiving coil 440 and any one of the transmitting coils 520, 524, 528, it is possible to drive any one of the transmitting coils 520, 524, 528 positioned directly below the receiving coil 440, thereby minimizing power dissipation.

Figure 4:
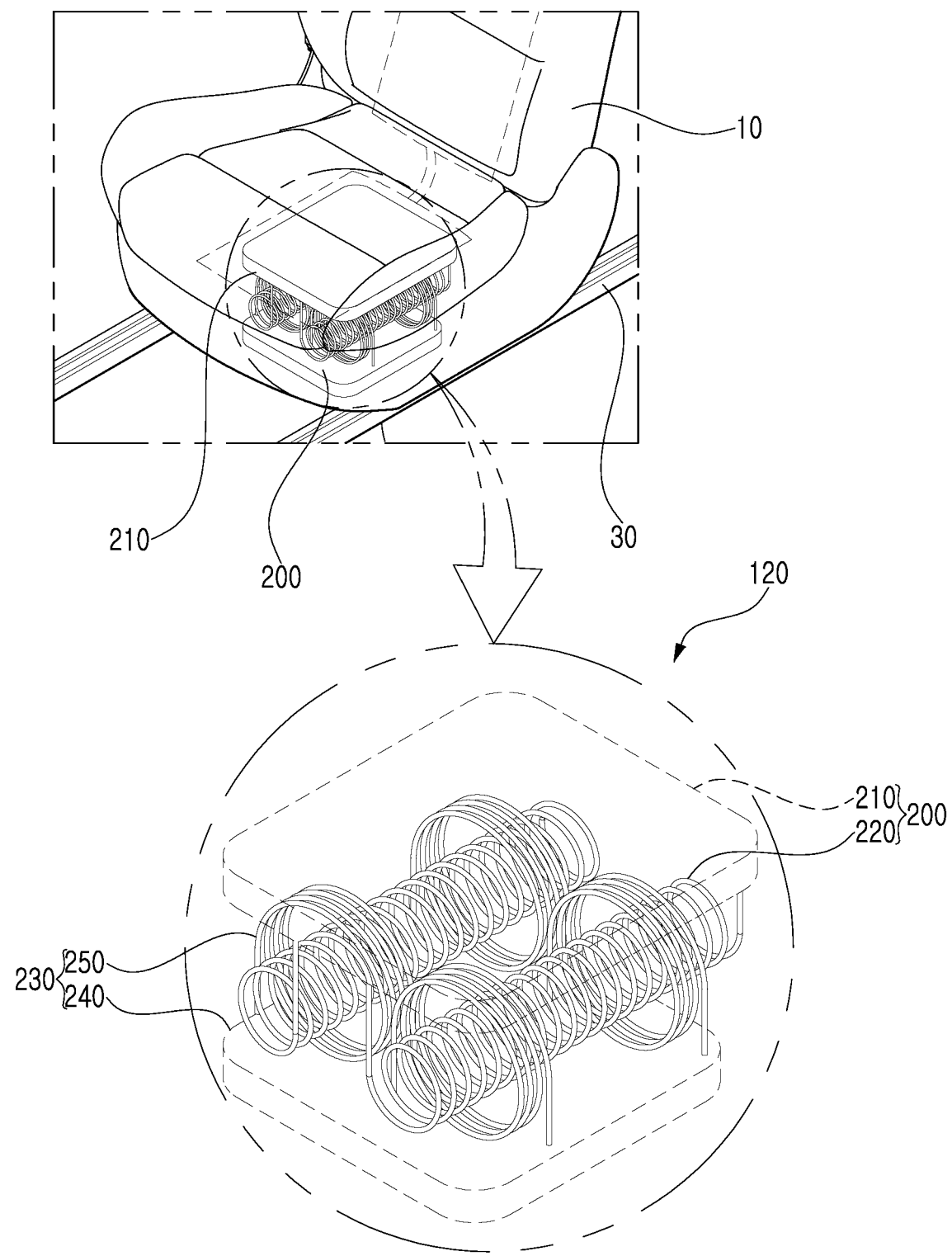
FIGS. 4 and 5 are perspective views of a wireless power transmission device in accordance with another embodiment disclosed herein.
Figure 5:
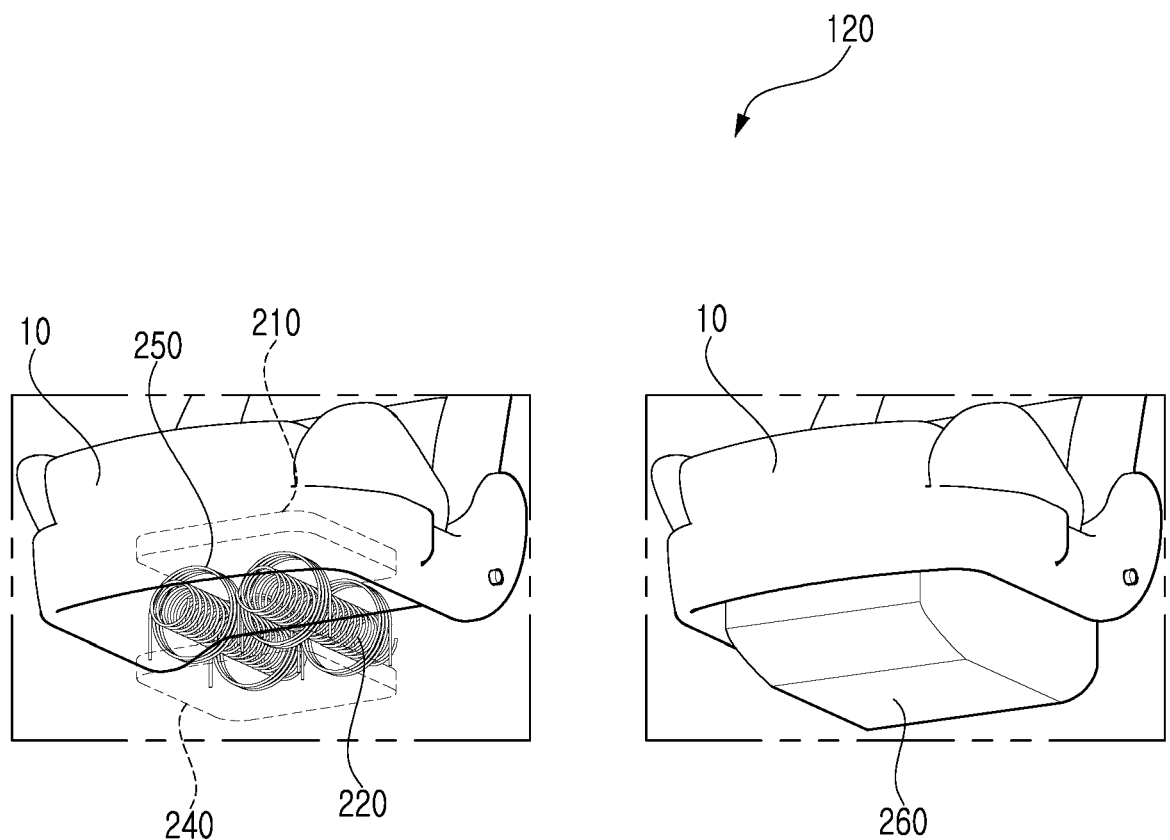

FIGS. 4 and 5 illustrate perspective views of a wireless power transmission device in accordance with another embodiment disclosed herein.

A wireless power transmission device 120 according to the embodiment is substantially the same as the wireless power transmission device of FIGS. 1 to 3 except for a power receiving unit 200 and a power transmitting unit 230. Therefore, the same reference numerals and names are used here, and redundant descriptions are omitted.

As shown in FIGS. 4 and 5, the wireless power transmission device 120 includes a power receiving unit 200 and a power transmitting unit 230.

The power receiving unit 200 includes a wireless power receiver 210, a receiving coil 220, and a shield 260.

The power receiving unit 200 is coupled to the power transmitting unit 230 so as to slide to move forward or backward. The power receiving unit 200 may receive power wirelessly from the power transmitting unit 230 and supply power to the heating wire 20 or various electronic devices formed in the seat 10, and store power in a separate battery.

The wireless power receiver 210 transfers power received through the receiving coil 220 to the heating wire 20, and is coupled to the lower portion of the seat 10 and moves together as the seat 10 rotates or moves forward and backward.

One ends of each of the receiving coils 220 are spaced apart from each other in opposite sides and coupled to a front of the wireless power receiver 210, and the other ends thereof extend in a direction opposite phases to each other in a backward direction in a spiral shape and are coupled to a rear of the wireless power receiver 210, thereby forming a coil shape as a whole.

Each of the receiving coils 220 receives AC power transmitted from the power transmitting unit 230. The wireless power receiver 210 converts the AC power received in the receiving coils 220 into DC power and supplies it to the heating wire 20.

The power transmitting unit 230 includes a wireless power transmitter 240 and transmitting coils 250.

The power transmitting unit 230 is coupled to a frame of the vehicle. The power transmitting unit 230 receives power from a battery or a generator inside the vehicle and wirelessly transfers power to the power receiving unit 200 to supply power to the electronic device including the heating wire 20 inside the seat 10.

The wireless power transmitter 240 is formed in a plate shape. The wireless power transmitter 240 is disposed below the seat 10, is spaced apart from and below the wireless power receiver 210, and is coupled to the frame of the vehicle and fixed to the vehicle.

One end of each of the transmitting coils 250 is coupled to the wireless power transmitter 240, and the other end extends toward an upper portion to surround an outer surface of one of the receiving coils 220, thereby forming a coil shape as a whole.

The transmitting coils 250 are spaced apart from each other in a front and rear of each of the receiving coils 220. Even when the seat 10 slides to move forward or backward, the receiving coils 220 may move forward or backward through the transmitting coils 250.

Accordingly, the receiving coils 220 may receive power wirelessly through the transmitting coils 250 even during the sliding movement of the seat 10, and the transmitting coil 250 and the receiving coil 220 maintain a certain distance from each other regardless of a position of the seat 10, so that wireless power transmission and reception may be smoothly performed.

The number of the receiving coils 220 and the transmitting coils 250 may vary depending on a size of the seat 10 or the vehicle, and the number of transmitting coils 250 surrounding the receiving coils 220 may also vary depending on the size of the seat 10 or the vehicle.

The receiving coils 220 or transmitting coils 250 may be in the form of a polygonal coil, and may be formed of different types of coils and be disposed so as to be capable of sliding movement with respect to each other.

The shield 260 is coupled to the lower portion of the seat 10 to surround the wireless power transmission device 120. The shield 260 blocks electromagnetic waves and a foreign matter, which are essentially generated in the power transmitting unit 230, from being emitted to the outside.

With the installation of the shield 260, the electromagnetic wave generated from the wireless power transmission device 120 is blocked, and thus, the influence of electromagnetic waves on the passenger is effectively reduced. Further, it is possible to reduce the influence of electromagnetic waves on the passenger effectively, to reduce electromagnetic wave EMI level, and to block metal foreign substances around the wireless power transmission device 120.

Figure 6:
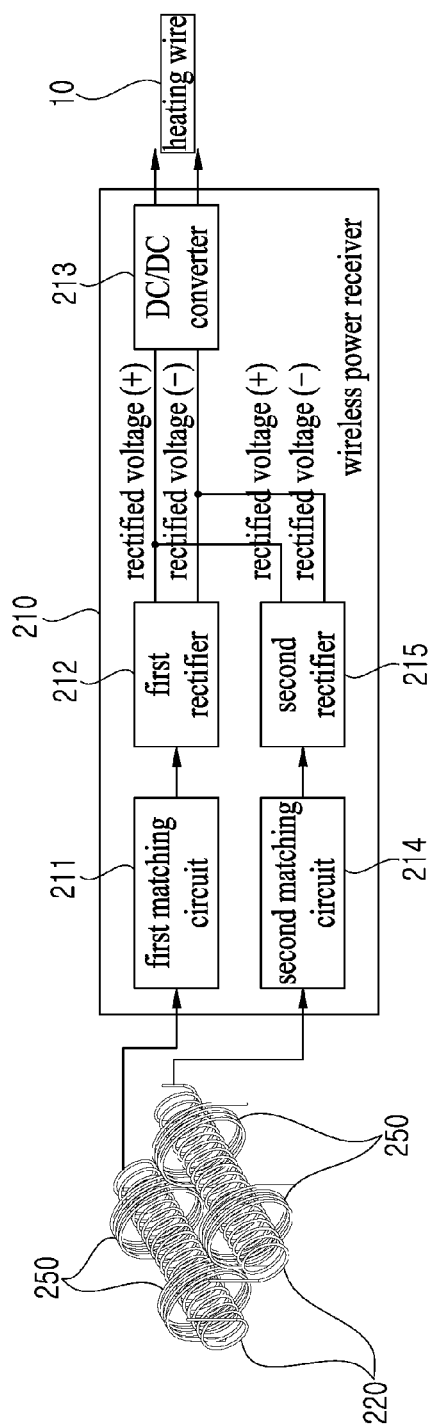
FIG. 6 is a block diagram of a wireless power receiver of the wireless power transmission device in FIG. 4.

FIG. 6 illustrates a block diagram of a wireless power receiver of the wireless power transmission device in FIG. 4.

As shown in FIG. 6, the wireless power receiver 210 includes first and second matching circuits 211 and 214, first and second rectifiers 212 and 215, and a DC/DC converter 213.

Each of the first and second matching circuits 211 and 214 is connected to each of the receiving coils 220 spaced apart from each other in opposite sides, and receives the power transmitted in the transmitting coils 250 surrounding each of the receiving coils 220.

The first rectifier 212 is connected to the first matching circuit 211, and converts AC power transmitted from the first matching circuit 211 to a rectified output and transmits it to the DC/DC converter 213. The second rectifier 215 is connected to the second matching circuit 214 and converts AC power transmitted from the second matching circuit 214 to a rectified output and transmits it to the DC/DC converter 213.

The rectified outputs in the same polarity output from the first and second rectifiers 212 and 215 are combined and connected to the DC/DC converter 213. The relatively high rectified output among the rectified outputs output from the first rectifier 212 or the second rectifier 215 is converted and transferred to the heating wire 20.

Figure 7:
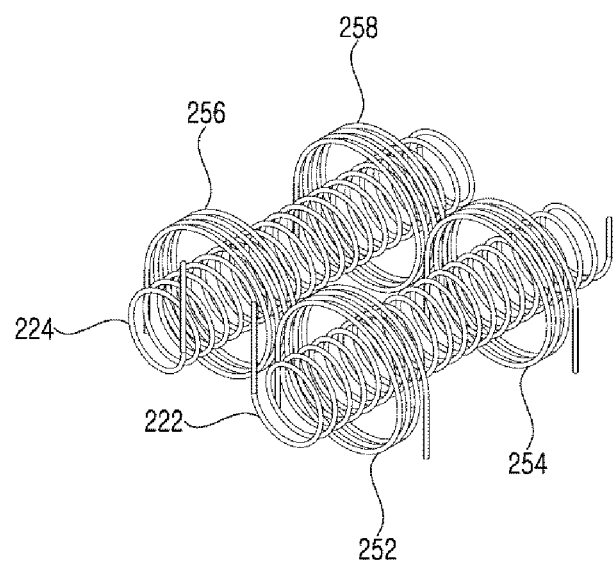
FIG. 7 is schematic diagrams illustrating an electromagnetic wave reduction structure of the wireless power transmission device in FIG. 4.
Figure 7:
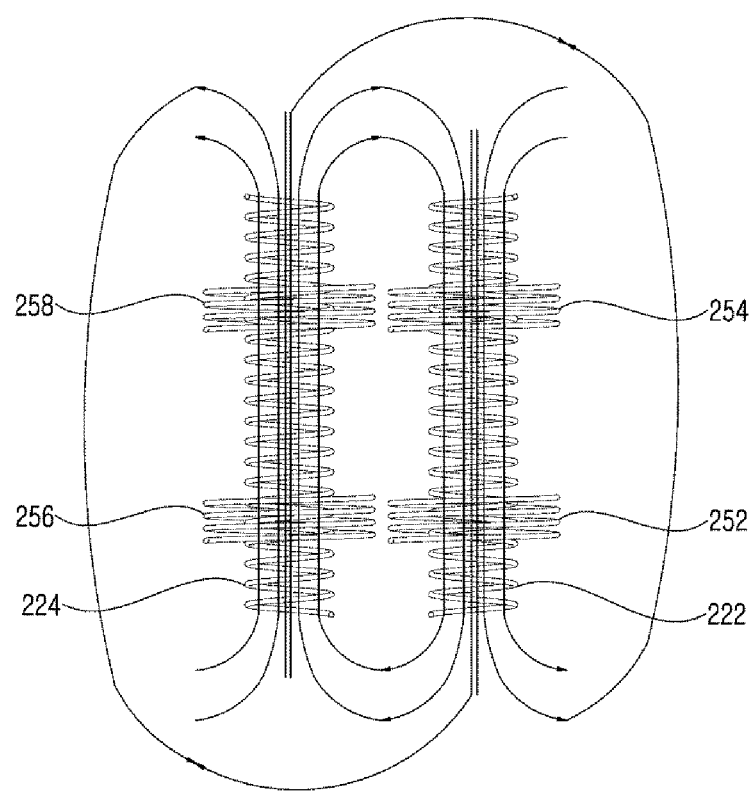
Figure 8:
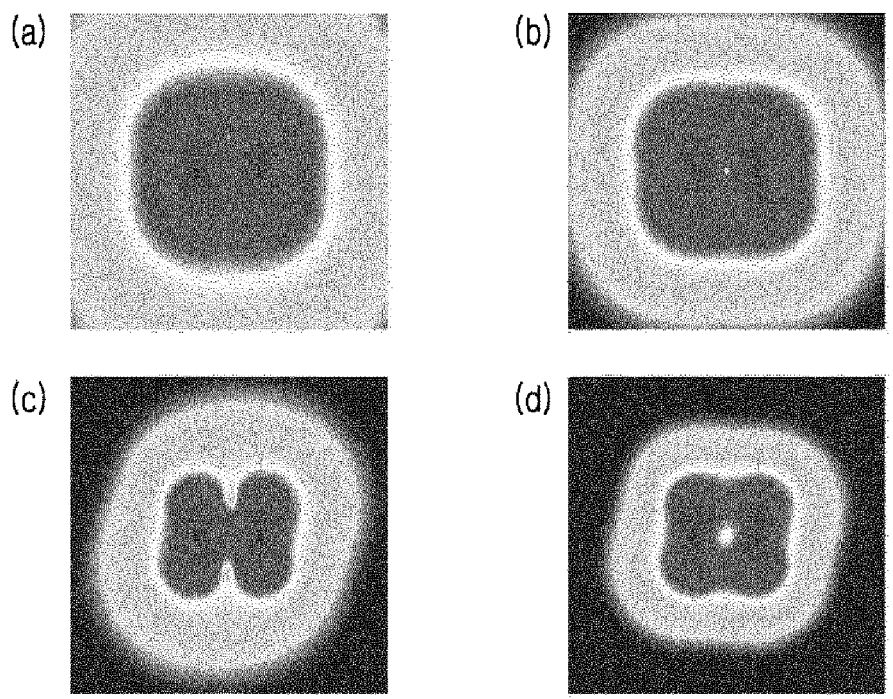
FIG. 8 is an image illustrating an electric field and a magnetic field according to phase of the wireless power transmission device in FIG. 4.

FIG. 7 illustrates schematic diagrams illustrating an electromagnetic wave reduction structure of the wireless power transmission device in FIG. 4. FIG. 8 illustrates images illustrating an electric field and a magnetic field according to phase of the wireless power transmission device in FIG. 4.

As shown in FIGS. 6 to 8, the transmitting coil 250 includes a first transmitting coil 252, a second transmitting coil 254, a third transmitting coil 256, and a fourth transmitting coil 258, and the receiving coil 220 includes a first receiving coil 222 and a second receiving coil 224.

Each of the first and second transmitting coils 252, 254 is spaced apart from each other in a front and rear direction, and surrounds a portion of the front and rear portions of the first receiving coil 222, respectively. Each of the third and fourth transmitting coils 256, 258 surrounds the second receiving coil 224 at a position adjacent to each of the first and second transmitting coils 252, 254.

The first and second receiving coils 222 and 224 are disposed on the same horizontal line. Each of the first and second receiving coils 222 and 224 is in the form of a coil extending from the front to the rear in different directions.

Specifically, one ends of each of the first and second receiving coils 222 and 224 are disposed at a position adjacent to each other in the front thereof, and the other ends extend toward the rear thereof while rotating toward different directions each other, thereby making a coil shape.

One end of the first transmitting coil 252 is coupled to the wireless power transmitter 240 an outer side of the front of the first transmitting coil 252, and the other end extends in a coil shape toward the rear thereof while rotating in the same direction as a rotation extension direction of the first receiving coil 222, and is coupled to the wireless power transmitter 240.

One end of the second transmitting coil 254 is connected to the wireless power transmitter 240 between the first receiving coil 222 and the second receiving coil 224, and the other end extends in a coil shape toward the rear thereof while rotating in a direction opposite to the rotation extension direction of the first receiving coil 222, and is coupled to the wireless power transmitter 240.

One end of the third transmitting coil 256 is connected to the wireless power transmitter 240 at an outer side of the front of the second receiving coil 224, and the other end thereof extends in a coil shape toward the rear thereof while rotating in the same direction as a rotation extending direction of the second receiving coil 224 and is coupled to the wireless power transmitter 240.

One end of the fourth transmitting coil 258 is connected to the wireless power transmitter 240 between the first receiving coil 222 and the second receiving coil 224, and the other end thereof extends in a coil shape toward the rear thereof while rotating in a direction opposite to the rotation extending direction of the second receiving coil 224 and is coupled to the wireless power transmitter 240.

Accordingly, when the wireless power transmission device 120 is driven, magnetic fields between the first and second receiving coils 222, 224 move and reinforce in the same direction each other, and magnetic fields moving toward an outer side of each of the first and second receiving coils 222, 224 are offset in each of the rear and front by each of the relatively externally positioned magnetic fields of the magnetic fields moving towards an inside of each of the second and first receiving coils 224, 222.

According, in each of the first and second receiving coils 222, 224, magnetic fields moving toward the outer side thereof among magnetic fields generated around each other in a state of being adjacent to each other cancel each other, and magnetic fields moving toward each other are reinforced, thereby reducing external movement of EMF (Electromagnetic Field) and EMI (Electromagnetic Interference) generated in the wireless power transmission device 120.

The first transmitting coil 252 and the second transmitting coil 254 may be formed as a low-frequency coil 542 as will be described below with reference to FIGS. 13 and 15, and the third transmitting coil 256 and the fourth transmitting coil 258 may be formed as a high-frequency coil 544 as will be described below with reference to FIG. 14.

Each of the first and second receiving coils 222, 224 is elongated forward or backward thereof such that it is possible to prevent the seat 10 from colliding with the first to fourth transmitting coils 252, 254, 256, 258 while reciprocally moving forward or backward along the rail 30.

Referring to FIG. 8, the wireless power transmission device 120 may reduce EMF and EMI emitted to the outside by controlling phase of frequencies of the first and second transmitting coils 252, 254 and phase of frequencies of the third and fourth transmitting coils 256, 258 to 0 and 180 degrees, respectively.

An image (a) in FIG. 8. shows an electric field when the phases of the frequencies of the first and second transmitting coils 252, 254 and the phases of the frequencies of the third and fourth transmitting coils 256, 258 are in phase each other. An image (b) in FIG. 8. shows an electric field when the phases of the frequencies of the first and second transmitting coils 252, 254 and the phases of the frequencies of the third and fourth transmitting coils 256, 258 are in opposite phases to each other.

Comparing the images (a) and (b), it may be found that when the phases of the frequencies of the first and second transmitting coils 252, 254 and the phases of the frequencies of the third and fourth transmitting coils 256, 258 are in opposite phases to each other, the electric field externally emitted decreases compared to (a) because the electric field does not reach an edge in the image (b).

An image (c) shows a magnetic field when the phases of the frequencies of the first and second transmitting coils 252, 254 and the phases of the frequencies of the third and fourth transmitting coils 256, 258 are in phase each other. An image (d) shows a magnetic field when the phases of the frequencies of the first and second transmitting coils 252, 254 and the phases of the frequencies of the third and fourth transmitting coils 256, 258 are in opposite phases to each other.

Comparing the images (c) and (d), it may be found that when the phases of the frequencies of the first and second transmitting coils 252, 254 and the phases of the frequencies of the third and fourth transmitting coils 256, 258 are in opposite phases to each other, the magnetic field externally emitted is reduced because an area formed between the electric field and an edge in the image (d) is relatively wider than an area between the electric field and the image in (c).

According, when the phases of the frequencies of the first and second transmitting coils 252, 254 and the phases of the frequencies of the third and fourth transmitting coils 256, 258 are in opposite phases to each other, the EMF and the EMI transferred to the passenger sitting on the seat 10 may be reduced without installing a separate shield 260.

Figure 9:
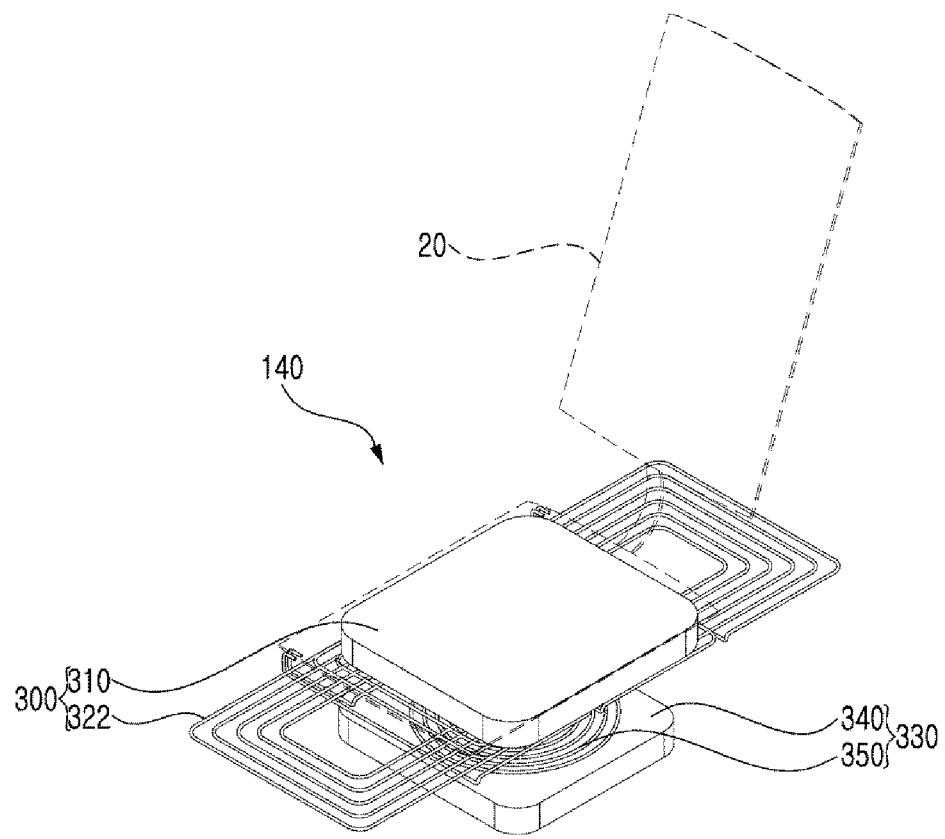
FIGS. 9 and 10 are perspective and plan views of a wireless power transmission device in accordance with another embodiment of the disclosure disclosed herein, respectively.
Figure 9:
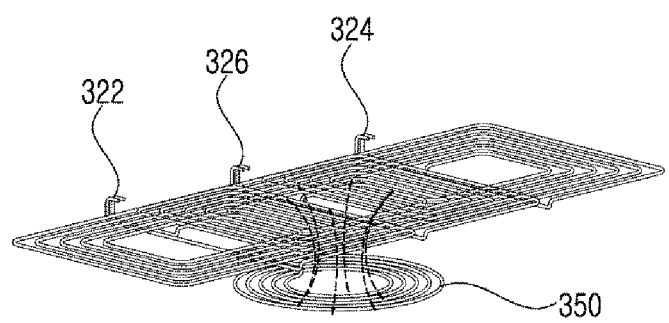
Figure 10:
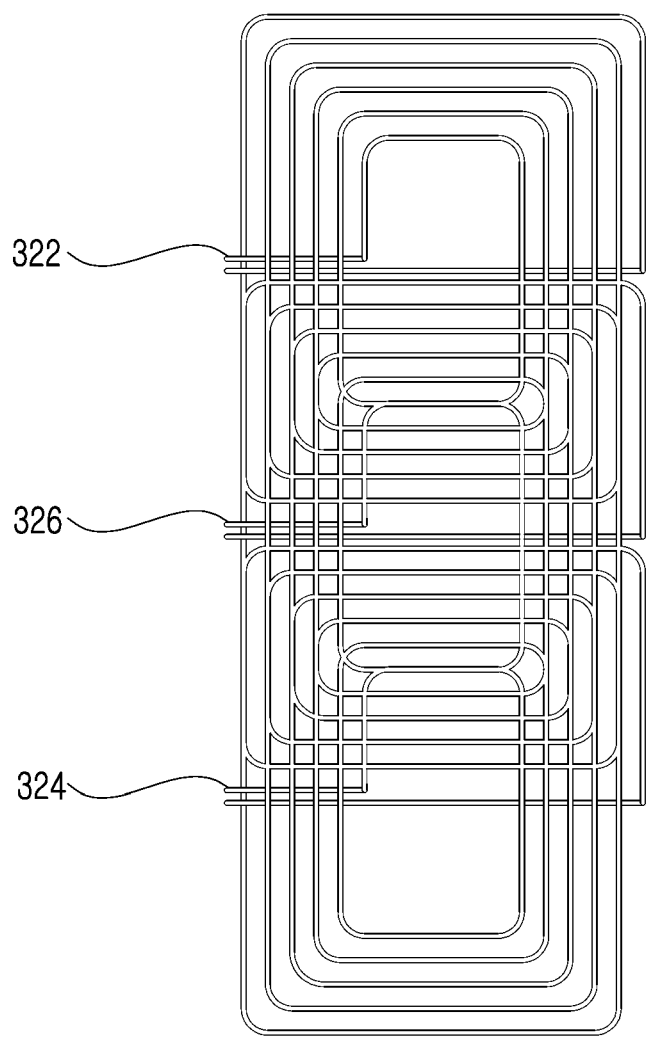

FIGS. 9 and 10 illustrate perspective views of a wireless power transmission device in accordance with another embodiment of the disclosure disclosed herein.

A wireless power transmission device 140 according to the embodiment is substantially the same as the wireless power transmission device of FIG. 4 except for a power receiving unit 300 and a power transmitting unit 330. Therefore, the same reference numerals and names are used here, and redundant descriptions are omitted.

As shown in FIGS. 9 and 10, the wireless power transmission device 140 includes a power receiving unit 300 and a power transmitting unit 330.

The power receiving unit 300 includes a wireless power receiver 310 and receiving coils 322, 324, 326.

The power receiving unit 300 is coupled to the power transmitting unit 330 so as to slide to move forward or backward. The power receiving unit 300 may receive power wirelessly from the power transmitting unit 330 and supply power to the heating wire 20 or various electronic equipment formed in the seat 10, and store power in a separate battery.

The wireless power receiver 310 transfers power received through the receiving coil 320 to the heating wire 20, and is coupled to the lower portion of the seat 10 and moves together as the seat 10 rotates or moves forward and backward.

Each of the receiving coils 322, 324, 326 may be formed in the form of a square pancake-shaped coil, and may be formed in the form of a circular or polygonal pancake-shaped coil depending on a type of the vehicle or the environment inside the vehicle. Each of the receiving coils 322, 324, 326 is electrically connected to a lower portion of the wireless power receiver 310.

The receiving coils 322 and 324 are disposed to be spaced apart from each other forward and backward. The other receiving coil 326 is disposed between the receiving coils 322 and 324 on a different horizontal line from the receiving coils 322, 324, and is disposed such that one end and the other end of the receiving coil 326 intersect with each of the receiving coils 322 and 324 on the same vertical line.

Accordingly, the receiving coils 322, 324, 326 are sequentially disposed from the front to the rear and are formed to extend forward and backward. The receiving coils 322, 324, 326 are coupled to the wireless power receiver 310 and slide to move forward or backward as the seat 10 moves.

The power transmitting unit 330 includes a wireless power transmitter 340 and a transmitting coil 350.

The power transmitting unit 330 is coupled to the frame of the vehicle. The power transmitting unit 330 receives power from a battery or a generator inside the vehicle and wirelessly transfers power to the power receiving unit 300 to supply power to the electronic devices including the heating wire 20 inside the seat 10.

Specifically, the wireless power transmitter 340 is formed in a plate shape. The wireless power transmitter 340 is disposed below the seat 10, is spaced apart from and below the wireless power receiver 210, and is coupled to the frame of the vehicle and fixed to the vehicle.

The receiving coil 350 may be formed in the form of a circular pancake-shaped coil, and may be formed in the form of a square or polygonal pancake-shaped coil depending on a type of the vehicle or the environment inside the vehicle.

The transmitting coil 350 is disposed at an upper portion of the wireless power transmitter 340 and is electrically connected to the wireless power transmitter 340, and is disposed to be spaced apart from and below the receiving coils 322, 324, 326.

Accordingly, since the transmitting coil 350 is always disposed below one of the receiving coils 322, 324, and 326, it is possible to transmit power wirelessly regardless of a position of the seat 10, even if the receiving coil 322, 324, 326 moves forward or backward due to the movement of the seat 10.

The receiving coil 326 may be formed as a low-frequency coil 542 as will be described below and disclosed in FIG. 15. Each of the remaining receiving coils 322 and 324 may be formed as a high-frequency coil 544.

Figure 11:
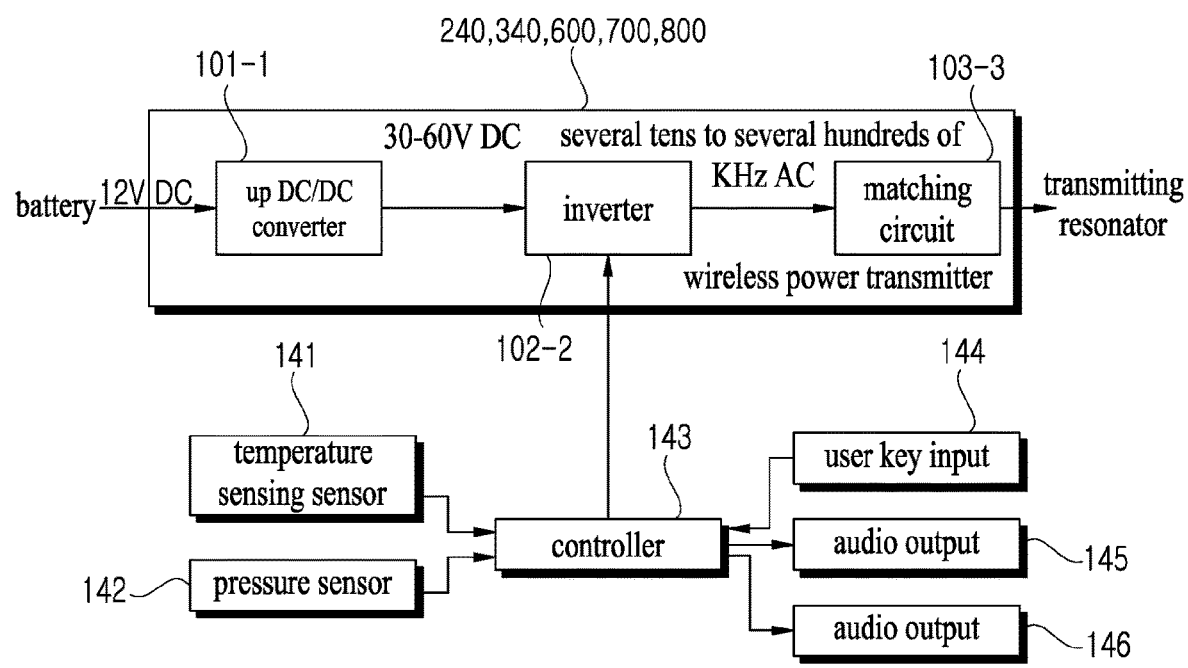
FIG. 11 is a block diagram illustrating driving of each of the wireless power transmission devices in FIGS. 1 to 10 disclosed herein.

FIG. 11 illustrates a block diagram illustrating the driving of each of the wireless power transmission devices in FIGS. 1 to 10 disclosed herein.

As shown in FIG. 11, each of the wireless power transmission devices 100, 120, 140 includes a temperature sensing sensor 141, a pressure sensor 142, a controller 143, a user key input 144, an audio output 145, and a display 146.

Each of the wireless power transmitters 240, 340, 600, 700, 800 is connected to a battery or generator within the vehicle, and includes an up DC/DC converter 101-1, an inverter 102-2, and a matching circuit 103-3.

The up DC/DC converter 101-1 converts a power source (12V DC) of the battery into a high DC power source (30-60V DC), and the inverter 102-2 converts the high DC power source into a high-frequency AC power source (several tens to several hundreds of KHz AC).

The matching circuit 103-3 matches the high-frequency AC power source converted by the inverter 102-2.

The temperature sensing sensor 141 senses an external temperature of the vehicle through the setting of a plurality of threshold values, and the pressure sensor 142 senses pressure by a weight of the passenger seated on the seat 10, in which the temperature sensing sensor 141 and the pressure sensor 142 are connected to the controller 143.

If a temperature of the outside of the vehicle is below a first threshold value (e.g., 5 degrees or less), and if the pressure sensor 142 senses that the passenger seated on the seat 10, the temperature sensing sensor 141 operates the heating wire 20 through the controller 143.

In this case, the pressure sensor 142 is operated through the controller 143 in a state in which the temperature sensing sensor 141 senses an external temperature below the first threshold value. Then, the controller 143 compares the sensed pressure with the set pressure based on the weight of the passenger set in the pressure sensor 142, and drives the power transmitters 240, 340, 600, 700, 800 when the sensed pressure is greater than the set pressure.

On the other hand, when the sensed pressure is compared with the set pressure by the weight of the passenger set in the pressure sensor 142, and the sensed pressure is relatively lower than the set pressure, the controller 143 keeps an operation of the inverter 102-2 in a setting standby state.

If the temperature of the outside of the vehicle is below a second threshold value (e.g., 10 degrees or less), and if the pressure sensor 142 senses that the passenger seated on the seat 10, a voice or message is given to the passenger through the audio output 145 or the display 146 to inquire as to whether the heating wire 20 should be operated, and the passenger may select whether the heating wire 20 should be operated.

In this case, the pressure sensor 142 is operated through the controller 143 in a state in which the temperature sensing sensor 141 senses the external temperature below the second threshold value. Then, the controller 143 compares the sensed pressure with the set pressure based on the weight of the passenger set in the pressure sensor 142. When the sensed pressure is greater than the set pressure, the controller 143 queries the passenger by the voice or message whether the heating wire 20 should be operated. Then, upon receipt of the accept response of the passenger, the controller 143 operates the inverter 102-2 to drive the wireless power transmitters 240, 340, 600, 700, 800.

On the other hand, when the temperature detection sensor 141 senses the external temperature exceeding the second threshold value, the controller 143 keeps the pressure sensor 142 in a setting standby state to interrupt the heating wire 20 from operating.

When the external temperature of the vehicle reaches a set third threshold value (for example, 15 degrees or more), the temperature sensing sensor 141 is configured to operate the heating wire 20 through manual control of the passenger irrespective of the driving of the pressure sensor 142.

In this case, the temperature sensor 141 may forcibly stop the driving of the pressure sensor 142, and the inverter 102-2 may be driven only by the manual control of the passenger. Further, when the external temperature sensed by the temperature sensing sensor 141 is less than the third threshold value, the driving of the inverter 102-2 is switched to the setting standby state.

Figure 12:
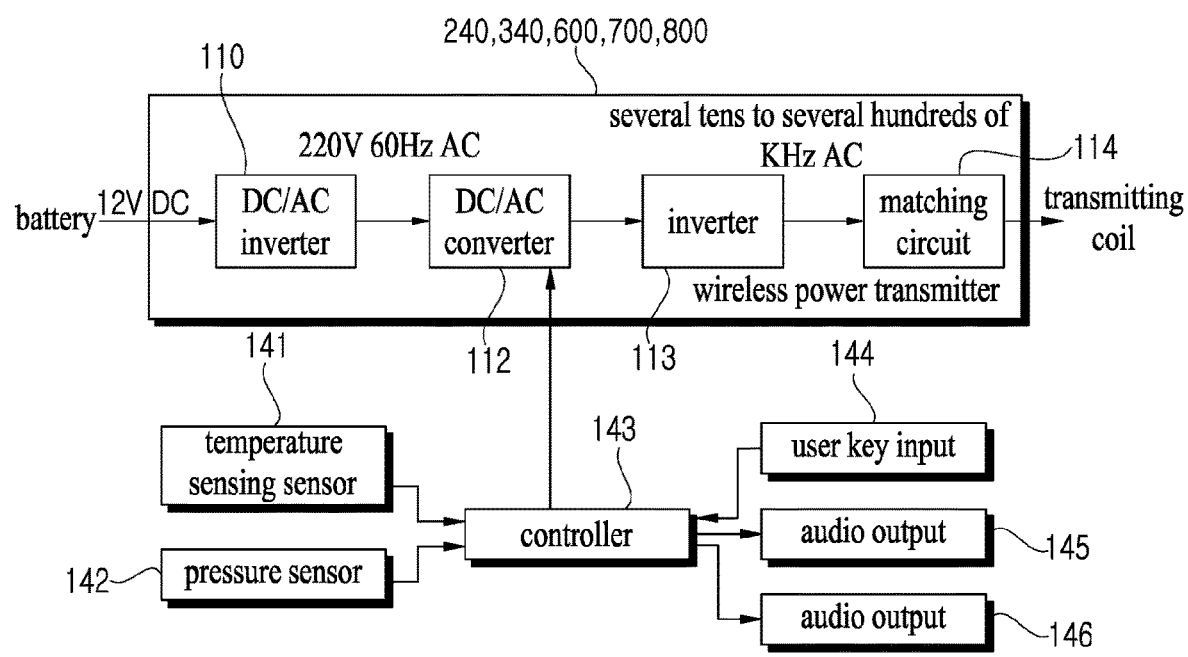
FIG. 12 is a block diagram illustrating another embodiment for driving each of the wireless power transmission devices in FIGS. 1 to 10 disclosed herein.

FIG. 12 illustrates a block diagram illustrating another embodiment for driving each of the wireless power transmission devices in FIGS. 1 to 10 disclosed herein.

The wireless power transmitters 240, 340, 600, 700, 800 according to the embodiment are substantially the same as the wireless power transmitters 240, 340, 600, 700, 800 of FIG. 12 except for the DC/AC inverter 110 and the DC/AC converter 112. Therefore, the same reference numerals and names are used here, and redundant descriptions are omitted.

As shown in FIG. 12, each of the wireless power transmitters 240, 340, 600, 700, 800 is connected to a battery or a generator in the vehicle, and includes a DC/DC inverter 110, a DC/AC converter 112, an inverter 113, and a matching circuit 114.

The DC/DC inverter 110 converts a power source of the battery into a low-frequency AC power source, and the AC/DC converter 112 converts the low-frequency AC power source converted by the DC/AC inverter 110 into a high DC power source.

The inverter 113 converts the high DC power source converted through the AC/DC converter 112 into a high-frequency AC power source, and the matching circuit 114 matches the high-frequency AC power source converted by the inverter 113.

The controller 143 is connected to a DC/AC converter 110, and operates the DC/AC converter 112 when the external temperature is below the first threshold value and through the temperature sensing sensor 141 and the pressure sensor 142 senses that the passenger is in the vehicle.

The controller 143 inquires the passenger by a voice or message whether the heating wire 20 should be operated when the external temperature is between the first threshold value and the second threshold value and the pressure sensor 142 senses that the passenger is in the vehicle, through the temperature sensing sensor 141 and the pressure sensor 142.

When the external temperature sensed through the temperature sensing sensor 141 exceeds the third threshold value, the controller 143 switches the pressure sensor 142 to the standby state and stops the driving of the heating wire 20 regardless of the passenger being in the vehicle.

Figure 13:
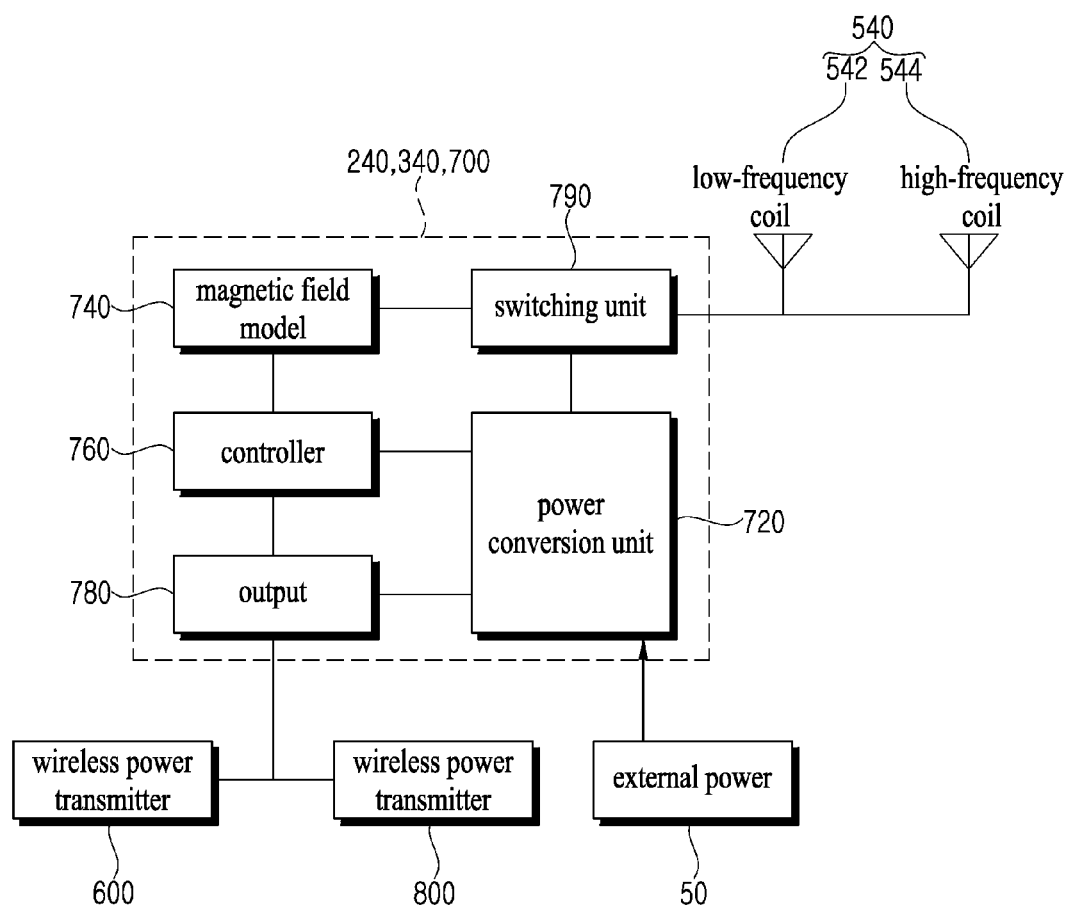
FIGS. 13 and 14 are block diagrams illustrating yet another embodiment for driving each of the wireless power transmission devices in FIGS. 1 to 10 disclosed herein.
Figure 14:
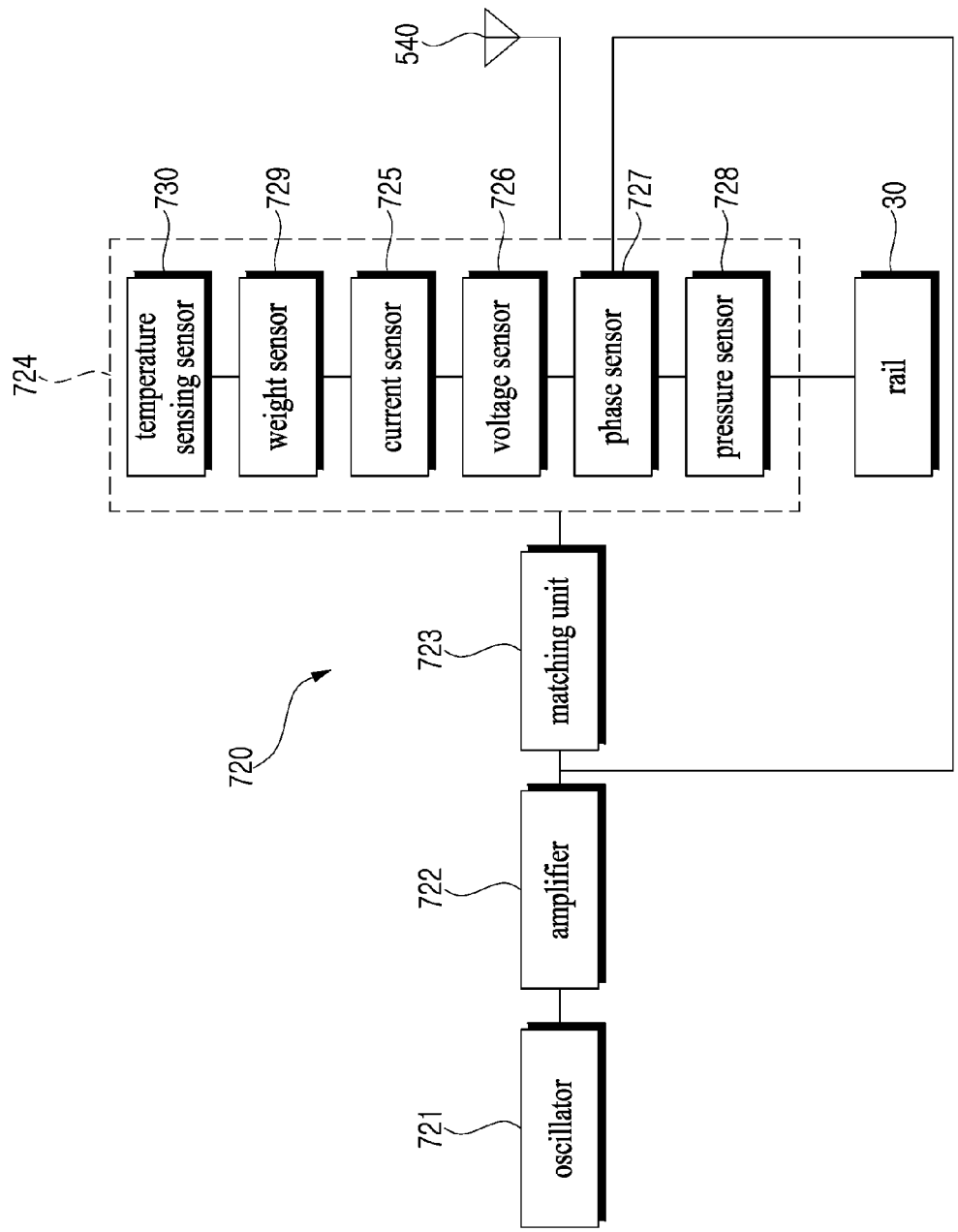

FIGS. 13 and 14 illustrate block diagrams illustrating another embodiment for driving each of the wireless power transmission devices in FIGS. 1 to 10 disclosed herein.

As shown in FIGS. 13 and 14, the wireless power transmitters 240, 340, 600, 700, 800 included in each of the wireless power transmission devices 100, 120, 140 are driven through the configuration disclosed in FIGS. 13 and 14. Further, unlike the wireless power transmission device 100, the wireless power transmission devices 120, 140 are driven through a single wireless power transmitter 240, 340.

Each of the wireless power transmitters 600, 700, 800 included in the wireless power transmission device 100 are connected to each other wirelessly or by a wire.

Each of the wireless power transmitters 240 and 340 and the wireless power transmitters 600, 700, 800 includes a power conversion unit 720, a magnetic field model 740, a controller 760, an output 780, and a switching unit 790.

The power conversion unit 720 is connected to an external power 50 including a battery and a generator of the vehicle to receive power, and converts it to AC power having a resonant frequency band between the power receiving unit 400 and the power transmitting unit 500.

The magnetic field modem 740 transmits and receives data for magnetic field communication between the power receiving unit 400 and the power transmitting unit 500 using a magnetic field communication protocol, in which the data includes the unique data.

The output 780 is wired to the output 780 of each of the wireless power transmitters 600, 800 disposed adjacent to the wireless power transmitter 700, and for the wireless power transmitters 600, 700, and 800, the output 780 are connected to each other to sense the states of each other through the output 780.

For the wireless power transmission devices 100, 120, 140, the controller 760 controls each of the power conversion unit 720, the magnetic field modem 740, the controller 760, and output 780 included in each of the wireless power transmitters 240, 340, 600, 700, 800. For the wireless power transmission device 100, the controller 760 drives or stops the power conversion unit 720 according to the states of the adjacent wireless power transmitters 600, 800 received through the output 780.

The power conversion unit 720 may sense current, voltage, or phase according to the frequency conversion during the sliding movement of the seat 10 through the connected transmitting coil 540 (corresponding to the transmitting coils 520, 524, 528 in FIGS. 1 to 3, the transmitting coil 250 in FIGS. 4 to 8, and the transmitting coil 350 in FIGS. 9 and 10). The controller 760 outputs a sensed signal to the wireless power transmitter 700 through the output 780 to drive the wireless power transmitter 700.

For the wireless power transmission device 100, the controller 760 outputs a sensed signal to the adjacent wireless power transmitters 600, 800 through the output 780 to drive the wireless power transmitters 600, 800, respectively.

When the controller 760 senses the movement of the seat 10 through the power conversion unit 720, each of the wireless power transmitters 240, 340, 600, 700, 800 driven through the sensed signal controls a switch and a plurality of capacitors formed in the switching unit 790, connects each power conversion unit 720 to a low-frequency coil 542, and receives the unique data transmitted from the power receiving unit 200, 300, 400.

For the wireless power transmission device 100, when any one of the power conversion units 720 of each of the wireless power transmitters 600, 700, 800 senses that the wireless power receiver 420 is positioned directly above thereof and the matching of a frequency for wireless power transmission is smooth, the power conversion unit 720 is connected to the high-frequency coil 544 through the switching unit 790. Whereas, when it detects that the matching of the frequency for the wireless power transmission is not matched, it stops the driving.

For the wireless power transmission devices 120, 140, when any one of the power conversion units 720 of each of the wireless power transmitters 240, 340 senses that the wireless power receivers 210, 310 are positioned directly therebelow and the matching of the frequency for wireless power transmission is smooth, the power conversion units 720 are connected to the high-frequency coil 544 through the switching unit 790. Whereas, when they detect that the matching of the frequency for the wireless power transmission is not matched, they stop driving.

Therefore, the AC power having the converted resonant frequency band in the power conversion unit 720 is transmitted to the transmitting coil 540 through the switching unit 790, and the low-frequency coil 542 or the high-frequency coil 544 is connected to the power conversion unit 720 according to whether the unique data is received.

As shown in FIG. 14, the power conversion unit 720 includes an oscillator 721, an amplifier 722, a matching unit 723, and a sensor unit 724.

The oscillator 721 generates a signal of a predetermined frequency for the wireless power transmission, in which the signal of the frequency is amplified through the amplifier 722, is frequency-matched through the matching unit 723, and then is transmitted by the transmitting coil 540.

The sensor unit 724 senses current, voltage, phase, pressure, the seating of the passenger, or the external temperature that is changed through the movement of the seat 10, and transmits the sensed signal to the controller 760. Then, the wireless power transmitters 240 and 340 wirelessly transmit power toward directly above.

For the wireless power transmission device 100, controller 760 transmits the sensed signal to the adjacent wireless power transmitters 600, 800 through the output 780. The wireless power transmitters 600, 800 received the sensed signal transmit wireless power toward directly above.

Specifically, the sensor unit 724 includes a current sensor 725, a voltage sensor 726, a phase sensor 727, a pressure sensor 728, a weight sensor 729 and a temperature sensing sensor 730.

The current sensor 725 is formed between the matching unit 723 and the transmitting coil 540. The current sensor 725 measures current transferred from the matching unit 723 to the transmitting coil 540, and senses a change in current moving from the matching unit 723 to the transmitting coil 540 when the receiving coil 440 positioned directly above the transmitting coil 540 moves due to the movement of the seat 10 or a foreign substance is formed.

When the current sensor 725 senses the change in current due to the movement of the seat 10 or the foreign matter, it transmits a sensed signal to the controller 760. For wireless power transmission device 100, the controller 760 transmits the sensed signal to the adjacent wireless power transmitters 600, 800.

The voltage sensor 726 measures voltage between the matching unit 723 and the transmitting coil 540 between the matching unit 723 and the transmitting coil 540, and transmits a sensed signal to the controller 760 when the voltage between the matching unit 723 and the transmitting coil 540 is different from voltage in a state where the wireless power transmission takes place due to the movement of the seat 10.

The phase sensor 727 is connected in parallel with the matching unit 723 to detect phase difference between signals before and after passing through the matching unit 723. When the phase sensor 727 senses a change in the phase difference of the signal passing through the matching unit 723 due to the movement of the seat 10, it transmits the sensed signal to the controller 760.

The pressure sensors 728 are formed on the rail 30 so as to be spaced apart from each other in a predetermined interval along the extending direction of the rail 30, and are formed in the lower portion of the seat 10. The pressure sensors 728 sense pressure of a roller inserted into the rail 30 so as to slide to move forward or backward.

Each position of the pressure sensors 728 is formed in a position of the roller in a state where each position of the wireless power receivers 210, 310 and 420 is positioned adjacent to the wireless power transmitters 240, 340, 600, 700 and 800 as the seat 10 moves.

For the wireless power transmission device 100, when the wireless power receiver 420 is positioned directly above any one of the wireless power transmitters 600, 700, 800 due to the movement of the seat 10 along the rail 30, each of the pressure sensors 728 transmits a sensed signal to the adjacent wireless power transmitter 600, 800 through the output 780.

For the wireless power transmission devices 120, 140, with the pressure sensors 728, it may know whether a position of each of the wireless power receivers 210, 310 is adjacent to or spaced apart from a position of each of the wireless power transmitters 240, 340 while the seat 10 moves along the rail 30.

Unlike the current sensor 725, the voltage sensor 726, or the phase sensor 727, the pressure sensor 728 is responsive to the physical effects of the roller. Therefore, the pressure sensor 728 senses complexly a movement state of the seat 10 sensed by the current sensor 725, the voltage sensor 726, or the phase sensor 727, and a state of the movement and stop of the seat 10 sensed through the pressure sensor 728, thereby sensing correctly the movement and movement direction of the seat 10.

The weight sensor 729 is formed in the seat 10. When the controller 760 analyzes the sensed signal of the weight sensor 729 and senses a weight greater than a preset threshold value by seating the passenger on the seat 10, it makes the wireless power to be transmitted through the transmitting coil 540 to the wireless power receivers 210, 310, 420 by controlling the power conversion unit 720 or the switching unit 790.

The temperature sensing sensor 730 senses the external temperature of the vehicle. The controller 760 analyzes the sensed signal of the temperature sensing sensor 730, and controls the power conversion unit 720 or the switching unit 790 to transmit the wireless power to the wireless power receivers 210, 310, 420 in order to operate the heating wire 20 when the external temperature is less than or equal to the first threshold value (e.g., 5 degrees or less).

Further, the controller 760 analyzes the sensed signal of the temperature sensing sensor 730, and when the external temperature is less than or equal to the second threshold value (e.g., 10 degrees or less), it inquires the passenger by a voice or message whether the heating wire 20 should be operated. When driving of the heating wire 20 is selected, the controller 760 makes the wireless power to be transmitted to the wireless power receivers 210, 310, 420 through the transmitting coil 540 to operate the heating wire 20.

Further, the controller 760 analyzes the sensed signal of the temperature sensing sensor 730, and when the external temperature is less than or equal to the third threshold value (e.g., 15 degrees or less), it inquires the passenger by the voice or message whether the heating wire 20 should be operated. When the driving of the heating wire 20 is selected, the controller 760 makes the wireless power to be transmitted to the wireless power receivers 210, 310, 420 to operate the heating wire 20.

Whereas, when the external temperature exceeds the third threshold value, the driving of the power conversion unit 720 or the switching unit 790 is stopped and the driving of the heating wire 20 is stopped. In this case, the heating wire 20 is driven only by manual control of the user.

The weight sensor 729 and the temperature sensing sensor 730 cooperate with each other, and when a threshold value of either the weight sensor 729 or the temperature sensing sensor 730 does not meet conditions for driving the power conversion unit 720 or the switching unit 790, the operation of the power conversion unit 720 or the switching unit 790 is stopped.

Accordingly, the power conversion unit 720 may accurately grasp the movement of the seat 10 through the sensor unit 724 and a position where the seat 10 is stopped after the movement, and may locate the seat 10 through the pressure sensor 720 when the current sensor 725, the voltage sensor 726, or the phase sensor 727 fails to operate due to an electrical error.

Further, the power conversion unit 720 may sense the external temperature of the vehicle and whether the passenger is in the vehicle through the sensor unit 724. Moreover, the controller 760 analyzes in conjunction the external temperature of the vehicle and whether the passenger is in the vehicle, and then may automatically determine the driving of the heating wire 20 through the control of the power conversion unit 720 or the switching unit 790.

Also, it may be formed between the wireless power receivers 210, 310 and 420 and the wireless power transmitters 240, 340, 600, 700 and 800 through the sensor unit 724 to sense the degradation of the normal wireless power transmission, thereby improving the maintainability of the wireless power transmission function.

Figure 15:
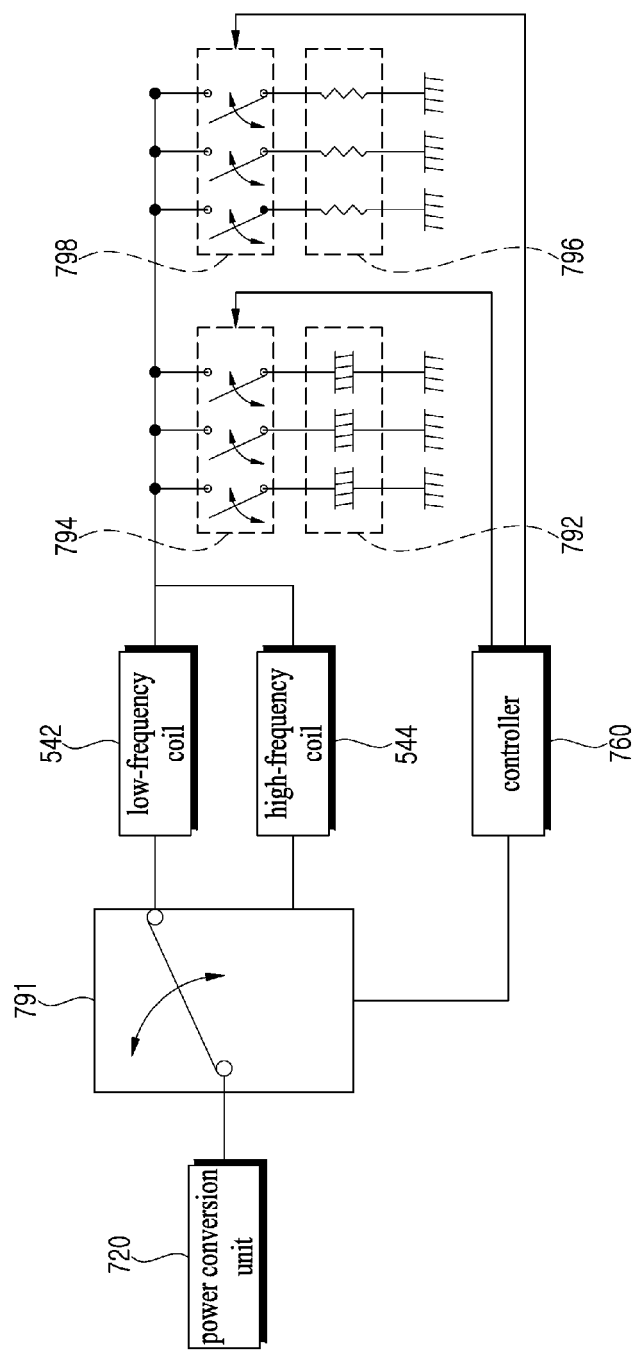
FIG. 15 is a specific configuration diagram of a switching unit in FIG. 13.

FIG. 15 is a specific configuration diagram of a switching unit in FIG. 13.

As shown in FIG. 15, the switching unit 790 includes a first switch 791, a second switch 794, a capacitor 792, a resistor 796, and a third switch 798.

AC power having the resonant frequency band converted by the power conversion unit 720 is transmitted to the low-frequency coil 542 or the high-frequency coil 544 via the first switch 791.

When the movement of the seat 10 is sensed through the sensor unit 724, the controller 760 drives the wireless power transmitter 240, the wireless power transmitter 340, or the wireless power transmitters 600, 700, 800. Then, each of the wireless power transmitters 240, 340, 600, 700, 800 drives the first switch 791 included in the switching unit 790 to connect the power conversion unit 720 to the low-frequency coil 542.

For the wireless power transmission devices 120, 140, when each of the wireless power transmitters 240, 340 receives the unique data, it drives the first switch 791, and it connects the power conversion unit 720 to the high-frequency coil 544 to wirelessly transmit power to the power receiving units 200, 300.

For the wireless power transmission device 100, when the wireless power transmitter 700 of the wireless power transmitters 600, 700, 800, in which the power receiving unit 400 is positioned directly above thereof, receives the unique data, it drives the first switch 791, connects the power conversion unit 720 to the high-frequency coil 544 to wirelessly transmit power to the power receiving unit 400, and transmits a drive interruption signal to two of the remaining wireless power transmitters 600, 700, 800 through the output 780.

The remaining wireless power transmitters 600, 800 received the drive interruption signal interrupt their driving and start driving again when the seat 10 moves again. When the receiver 400 is positioned directly above the wireless power transmitter 600, the drive interruption signal is transmitted to the remaining wireless power transmitters 700, 800.

When the receiver 400 is positioned directly above the wireless power transmitter 800, the drive interruption signal is transmitted to the remaining wireless power transmitters 600, 800.

The controller 760 identifies a case of receiving the unique data or a case of wireless power transmission through the high-frequency coil 544, and adjusts a Q factor (quality factor) of the switching unit 790, which is adjusted according to capacitance, to change the resonant frequency.

The Q factor is related to the charging efficiency. When power is transmitted only to the power receiving unit 400 positioned directly above any one of the wireless power transmitters 600, 700, 800, the controller 760 controls the number of capacitors 792 and resistors 796 connected between the high-frequency coil 544 and the controller 760 by controlling the second and third switches 794, 798, so as to have a narrow bandwidth and a high Q factor.

The controller 760 controls the number of capacitors 792 and resistors 796 connected between the low-frequency coil 542 and the controller 760 by controlling the second and third switches 794, 798, so as to have a wide bandwidth and a low Q factor for the communication including the unique data.

Accordingly, the wireless power transmission device 100 may drive any one of the wireless power transmitters 600, 700, 800 where the power receiving unit 400 is positioned directly above thereof by means of the unique data transmitted from the power receiving unit 400, thereby preventing the power dissipation.

Further, by sensing the external temperature, whether the passenger is in the vehicle, the current, the voltage, the phase, or the pressure of the roller on the rail 30 through the sensor unit 724 of the power conversion unit 720, the wireless power transmission devices 100, 120, 140 may sense the positions of the power receiving units 200, 300 and 400 included therein and determine whether the power conversion unit 720 or the switching unit 790 is driven. As such, the wireless power transmission devices 100, 120, 140 may minimize the power dissipation.

In addition, by sensing the external temperature, whether the passenger is in the vehicle, the current, the voltage, the phase, or the pressure of the roller on the rail 30 through the sensor unit 724 of the power conversion unit 720, the wireless power transmission device 100 may locate the position of the power receiving unit 400.

Also, by sensing the position of the power receiving unit 400, the wireless power transmission device 100 may stop driving the remaining two wireless power transmitters among the wireless power transmitters 600, 700, 800 that are not positioned directly below the power receiving unit 400, thereby preventing the power dissipation.

Although the preferred embodiments of the present invention have been described with reference to the accompanying drawings, the embodiments described herein and the configurations shown in the drawings are only the most preferred embodiments of the present invention and do not represent all the technical teachings of the present invention. Therefore, it is to be understood that at the time of this application, various equivalents and modifications may be substituted for these. Accordingly, the embodiments described above are to be understood as being illustrative and not restrictive in all respects. The scope of the present invention is defined by the following claims rather than the detailed description. All changes or modifications that drive from the meaning and range of equivalency of the claims, and from their equivalents, are to be interpreted as being included within the scope of the present invention.

The wireless power transmission device is a device that transmits power steadily and efficiently to electronic equipment, including a heating wire coupled to the seat of the vehicle in combination with the seat of the vehicle, and may be used in domestic or industrial vehicles.

What is claimed is:

1. A wireless power transmission device comprising:
    a power receiving unit coupled to a lower portion of a seat; and
    a power transmitting unit spaced apart from each other and disposed below the power receiving unit,
    wherein the power receiving unit is spaced apart from the power transmitting unit and slides along a moving direction of the seat, and the power receiving unit wirelessly receives power from the power transmitting unit and supplies the power to electronic equipment installed in the seat,
    wherein the power transmitting unit is arranged along an extending direction of rails coupled to the seat and disposed between the rails, the power transmitting further comprising:
    transmitting coils each having a coil shape; and
    a wireless power transmitter connected to the transmitting coils below the transmitting coils, wherein the wireless power transmitter receives external power and transmits the power to the transmitting coils and the transmitting coils supplies the power to the power receiving unit,
    wherein the power receiving unit further comprises:
    a receiving coil spaced apart from the transmitting coils, disposed above the transmitting coils, and wirelessly receiving power through the transmitting coils; and
    a wireless power receiver placed above the receiving coil and transferring the power received through the receiving coil to the electronic equipment provided in the seat.

2. The wireless power transmission device of claim 1, wherein the receiving coil has multiple coil elements, each formed in a coil shape and extending in the extending direction of the rail below the seat, wherein the multiple coil elements of the receiving coil are arranged to be spaced apart in opposite sides.

3. The wireless power transmission device of claim 1, wherein the transmitting coils are spaced apart from the receiving coils and are formed in a coil shape surrounding the receiving coil, wherein the transmitting coils are spaced apart from each other along an extending direction of the receiving coils,
    wherein a portion of a magnetic field generated around each of the receiving coils is offset when power is wirelessly transmitted to the receiving coils through the transmitting coils.

4. The wireless power transmission device of claim 3, wherein the wireless power transmitter supplies power to the transmitting coils or stop the power supply to the transmitting coils according to an external temperature of the vehicle while a passenger is seated on the seat.

5. The wireless power transmission device of claim 3, wherein the power transmitting unit further comprises a power conversion unit receiving external power and converting the external power into AC power, the power conversion unit sensing seat movement and a foreign matter through a change in current, voltage, or phase due to movement of the receiving coils.

6. The wireless power transmission device of claim 1, wherein the power receiving unit transmits unique data stored therein to any one of the transmitting coils positioned directly therebelow and drives any one of the transmitting coils positioned directly below the receiving coil.

7. The wireless power transmission device of claim 1, wherein the power transmitting unit further comprises a wireless power transmitter coupled to each of the transmitting coils and operating any one of the transmitting coils coupled to an upper portion thereof to transmit power when the receiving coil is positioned directly thereabove.

8. The wireless power transmission device of claim 7, wherein the wireless power transmitters each wirelessly transmit power to the receiving coil when sensing whether the receiving coil is positioned directly thereabove through a change in a pressure of pressure sensors formed on the rail.

* * * * *